US007723800B2

(12) United States Patent
Moens et al.

(10) Patent No.: US 7,723,800 B2
(45) Date of Patent: May 25, 2010

(54) DEEP TRENCH ISOLATION FOR POWER SEMICONDUCTORS

(75) Inventors: Peter Moens, Zottegem (BE); Bart Desoete, Anzegem (BE)

(73) Assignee: Semiconductor Components Industries, LLC, Phoenix, AZ (US)

( * ) Notice: Subject to any disclaimer, the term of this patent is extended or adjusted under 35 U.S.C. 154(b) by 76 days.

(21) Appl. No.: 12/126,803

(22) Filed: May 23, 2008

(65) Prior Publication Data

US 2008/0290461 A1 Nov. 27, 2008

(30) Foreign Application Priority Data

May 25, 2007 (EP) .................................. 07010439

(51) Int. Cl.
*H01L 27/088* (2006.01)

(52) U.S. Cl. ....................... 257/374; 257/397; 257/513; 257/E21.545; 438/207

(58) Field of Classification Search .................. 257/93, 257/374, 396–398, 446, 499, 510–521, 564, 257/647, 648; 438/207, 218, 219
See application file for complete search history.

(56) References Cited

U.S. PATENT DOCUMENTS 4,470,062 A 9/1984 Muramatsu
5,644,157 A 7/1997 Iida et al.
6,104,078 A * 8/2000 Iida et al. .................... 257/524
2008/0296636 A1* 12/2008 Darwish et al. ............. 257/256

OTHER PUBLICATIONS

V. Parthasarathy, V. Khemka, R. Zhu, I. Puchades, T. Roggenbauer, M. Butner, P. Hui, P. Rodriquez and A. Bose; A Multi Trench Analog+Logic Protection (M-TRAP) for Substrate Crosstalk Prevention in a 0.25 um Smart Power Platform with 100V High-side Capability; Proceedings of 2004 International Symposium on Power Semiconductor Devices & ICs Kitakyushu, pp. 427-430.

* cited by examiner

*Primary Examiner*—Evan Pert
*Assistant Examiner*—Scott R Wilson
(74) *Attorney, Agent, or Firm*—Rennie W. Dover

(57) ABSTRACT

An integrated power semiconductor device has an isolation structure having two or more isolation trenches, and one or more regions in between the isolation trenches, and a bias arrangement coupled to the regions to divide a voltage across the isolation structure between the isolation trenches. By dividing the voltage, the reverse breakdown voltage characteristics such as voltage level, reliability and stability can be improved for a given area of device, or for a given complexity of device, and avalanche breakdown at weaknesses in isolation structures can be reduced or avoided.

16 Claims, 5 Drawing Sheets

V0 V1 V2... ••• ...Vn-3 Vn-2 Vn-1 Vn
T1 T2 Tn-2 Tn-1 Tn
201 204 202 203 207 206 205 210

DEEP TRENCH ISOLATION FOR POWER SEMICONDUCTORS

CROSS-REFERENCE TO RELATED APPLICATIONS

This patent application claims the benefit of European Patent Application Serial No. 07010439.3, filed May 25, 2007, which patent application is incorporated herein by reference in its entirety.

BACKGROUND

1. The Field of the Invention

This invention relates to semiconductor devices, especially integrated semiconductor devices, and to methods of manufacturing such devices.

2. Description of the Related Art

Junction Isolated smart power technologies have the drawback of large lateral isolation structures, the area consumed by such structures being dependent on the required blocking voltage. The higher the voltage requirement, the more area needed. Vertical isolation is typically achieved by using highly doped implanted buried layers, requiring large thermal budgets.

Technologies processed on SOI (Silicon on Insulator) use trench isolation, guaranteeing both lateral and vertical isolation through oxide layers. However, SOI is still expensive. Moreover, it has some inherent drawbacks for power switching and high voltage applications: (1) in order to reduce the effect of the back-gate effect (substrate potential), the buried oxide needs to be thick, (2) a thick oxide poses a barrier to the heat generated in a power switch due to the much lower thermal diffusivity in oxide compared to silicon. Hence, the devices will be much more prone to thermal destruction upon power switching, and have to be designed accordingly.

A good compromise is to use deep trench isolation on a junction isolated technology. This way, the high packing density of trench structures can be combined with the good thermal properties of bulk silicon.

U.S. Pat. No. 4,140,558: B. T. Murphy et al., Isolation of Integrated Circuits Utilizing Selective Etching and Diffusion, Feb. 20, 1979 shows an early example of isolation.

U.S. Pat. No. 5,914,523: R. Bashir et al., "Semiconductor Device Trench Isolation Structure with Polysilicon Bias Contact", Jun. 22, 1999 shows a trench isolation structure which includes a field oxide (FOX) layer on the surface of the semiconductor substrate and an isolation trench which extends vertically through the FOX layer and into the semiconductor substrate. Because of this structural arrangement of the isolation trench, the isolation trench has both semiconductor substrate sidewalls and FOX sidewalls.

U.S. Pat. No. 6,362,064: J. M. McGregor et al., "Elimination of Walk-Out in High Voltage Trench Isolated Devices", Mar. 26, 2002 shows another example of trench isolation.

F. De Pestel et al., "Development of a Robust 50V 0.35 μm Based Smart Power Technology Using Trench Isolation", ISPSD 2003, pp182-185 again shows a single trench.

V. Parthasarathy et al., "A Multi-Trench Analog+Logic Protection (M-Trap) for Substrate Cross-talk Prevention in a 0.25 μm Smart Power Platform with 100V High-Side Capability", ISPSD, pp 427-430 (2004) shows an example having multiple trenches.

BRIEF SUMMARY OF THE INVENTION

An object of the invention is to provide improved semiconductor devices, especially integrated semiconductor devices, and methods of manufacturing such devices. According to a first aspect, the invention provides:

An integrated semiconductor device having an isolation structure having two or more isolation trenches, and one or more regions in between the isolation trenches, and a bias arrangement coupled to the regions and arranged to divide a voltage across the isolation structure between the two or more isolation trenches.

By dividing the voltage, the reverse breakdown voltage characteristics such as voltage level, reliability and stability can be improved for a given area of device, or for a given complexity of device, and avalanche breakdown at weaknesses in isolation structures can be reduced or avoided. Alternatively, for a given level of reliability, the reverse blocking voltage of the structure can be substantially improved. The bias arrangement can be used to divide the voltage to obtain a maximum overall breakdown voltage.

Optional additional features for dependent claims will be described below.

Another aspect of the invention provides methods of manufacturing such devices.

Another aspect of the invention provides a method of determining an optimum voltage between each of the different regions to obtain a maximum breakdown voltage. Some additional features relate to ways of implementing this voltage divider concept.

Isolation structure is intended to encompass any shape or configuration for partly or completely isolating electrically any area of the device from any other area, including planar isolation or vertical isolation for example.

Any of the additional features can be combined together and combined with any of the aspects. Other advantages will be apparent to those skilled in the art, especially over other prior art. Numerous variations and modifications can be made without departing from the claims of the present invention. Therefore, it should be clearly understood that the form of the present invention is illustrative only and is not intended to limit the scope of the present invention.

BRIEF DESCRIPTION OF THE DRAWINGS

How the present invention may be put into effect will now be described by way of example with reference to the appended drawings, in which.

DETAILED DESCRIPTION OF THE PREFERRED EMBODIMENTS

Figure 1:
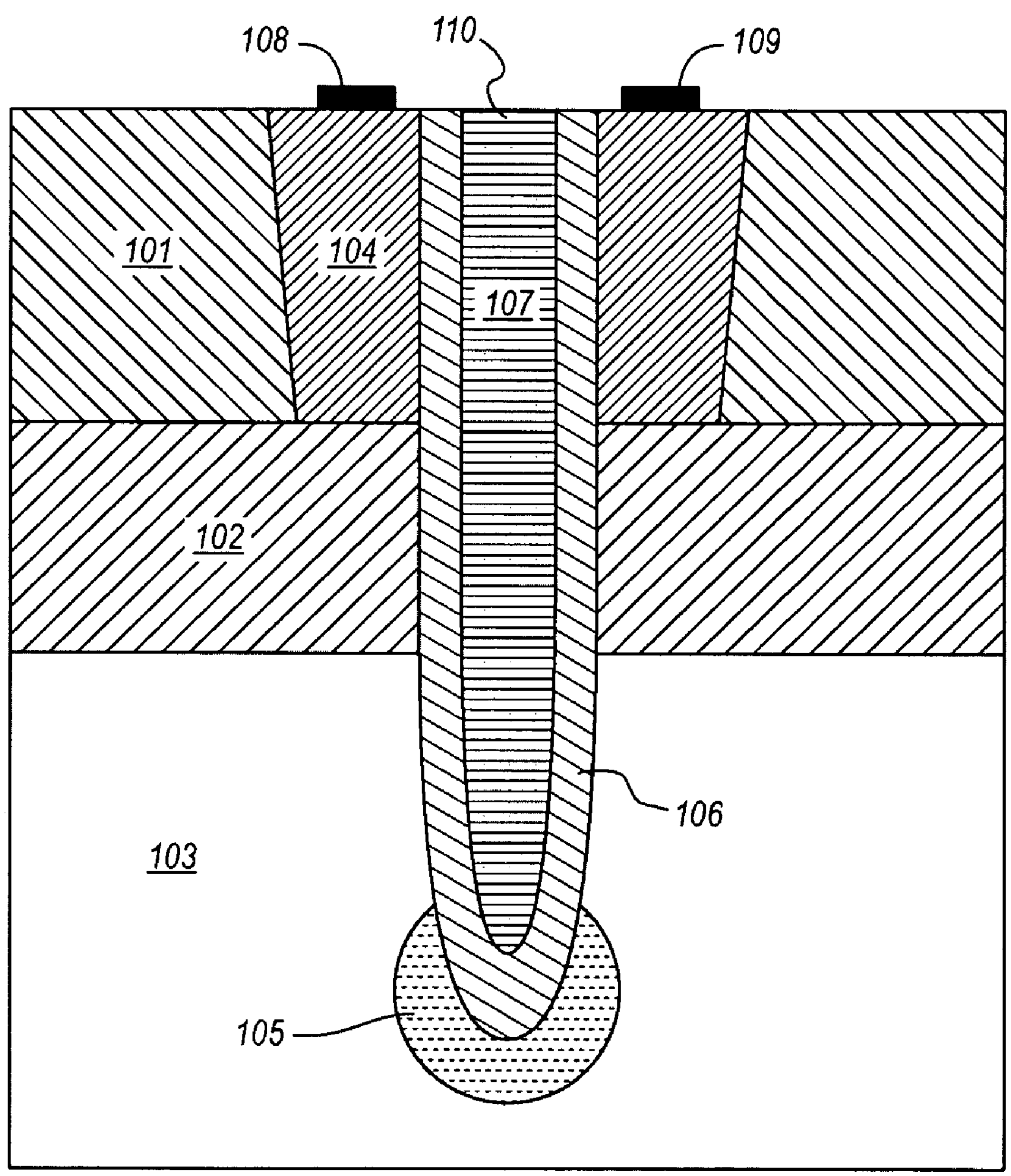
FIG. 1 shows a cross section of a reference device.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. “a” or “an”, “the”, this includes a plural of that noun unless something else is specifically stated.

The term “comprising”, used in the claims, should not be interpreted as being restricted to the means listed thereafter; it does not exclude other elements or steps. Thus, the scope of the expression “a device comprising means A and B” should not be limited to devices consisting only of components A and B. It means that with respect to the present invention, the only relevant components of the device are A and B.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

Embodiments of the present invention show isolation structures that can account for both lateral isolation (component-to-component) as well as vertical isolation (component-to-substrate). The structures can be area-efficient and be able to compete with SOI with respect to the substrate isolation at high temperature. Moreover, the breakdown of the structures can be sufficiently high. The embodiments involve ways to increase the reverse blocking voltage of such deep trench isolation structures. Unlike SOI, the proposed solutions can be cost-competitive and particularly for embodiments having no buried oxide, they can improve the power dissipation and temperature rise due to power pulsing. They can combine the area-efficiency of trench isolation with the advantageous thermal properties of silicon compared to oxide. The reverse breakdown can be improved by a novel approach involving layout and design solutions without necessarily requiring additional processing. In one aspect, a multiple trench structure is proposed to isolate two regions of an integrated circuit. The voltage applied to semiconductor regions between two successive trenches varies gradually between the voltages seen in the two regions to be isolated. The voltage variation from one region to the other can be optimized to achieve maximum reverse blocking capability of this so-called “voltage divider concept”. The voltage variation from one region to another does not imply that there is a direct metallic connection between the regions. The voltage differences may be achieved by a biasing circuit, capacitive coupling, etc. The present invention also provides an analytical model for determining an optimum voltage for each pocket.

FIG. 1 shows a schematic cross section view representing known structures. It shows a deep trench isolation—see De Pestel et al mentioned above. On top of a substrate of a first conductivity type, e.g. a p-substrate (103), a highly doped buried layer (102) of opposite conductivity, i.e. a second conductivity type (hence n-type), is created by doping, e.g. by ion implantation and subsequent thermal annealing. By using a blanket i.e. non-masked approach, a sheet resistance of ~10 to 15 Ω/square can be achieved. On top of the buried layer (102) a lowly doped epitaxial layer (101) of the same conductivity type as the buried layer (102) is grown. All active devices are to be made in the lowly doped epitaxial layer (101), with doping levels typically between $10^{15}$-$10^{17}$ $cm^{-3}$.

In order to connect the buried layer (102) at the top silicon, a self-aligned sinker (104) of the same conductivity type as the buried layer (102) is made. Two epitaxial pockets are isolated from each other by a deep trench structure (110),—“deep” meaning that it extends at least several μm into the substrate (103), e.g. 1-3 μm or more. The deep trench extends across the epitaxial layer (101), the buried layer (102) and ends in the substrate (103). After being etched, a thick isolation layer (106) is grown or deposited on the trench sidewall. This can be oxide, nitride, or a combination of both, for example. The remaining trench is filled with a filling material (107) like polysilicon, i.e. a conductive material. Both epitaxial pockets (104) are connected by conductive contacts such as metal contacts (108) and (109). If necessary, also the trench filling (107), e.g. polysilicon, can be separately contacted and biased, as in U.S. Pat. No. 5,914,523 mentioned above. In order to kill the parasitic MOS transistor (contact (108) serving e.g. as source, contact (109) serving as drain, filling layer (107) as gate electrode if conducting, insulator (106) as gate dielectric and (103) as substrate terminal), a p-stop implant (105) is implanted at the trench bottom after trench etch. A similar structure is proposed in U.S. Pat. No. 4,140,558 (dated Feb. 20, 1979).

In contrast to the way that reverse breakdown of single trench isolation structures has been addressed in the past, i.e. by applying an external voltage to the trench poly, as in U.S. Pat. No. 5,914,523 and U.S. Pat. No. 6,362,064 mentioned above, some embodiments of the present invention described below involve leaving the trenches floating, and not contacting them. In fact, as they are floating, the trenches will float to an intermediate potential, determined by $V_{i-1}$, $V_i$ and $V_{sub}$ (for the i-th trench), thus enabling the “voltage divider concept” of the present invention. The above mentioned paper of Parthasarathy et al. shows a multi-trench structure, but the inner silicon islands are not contacted, and the advantages of the voltage divider concept are not achieved.

Figure 2:
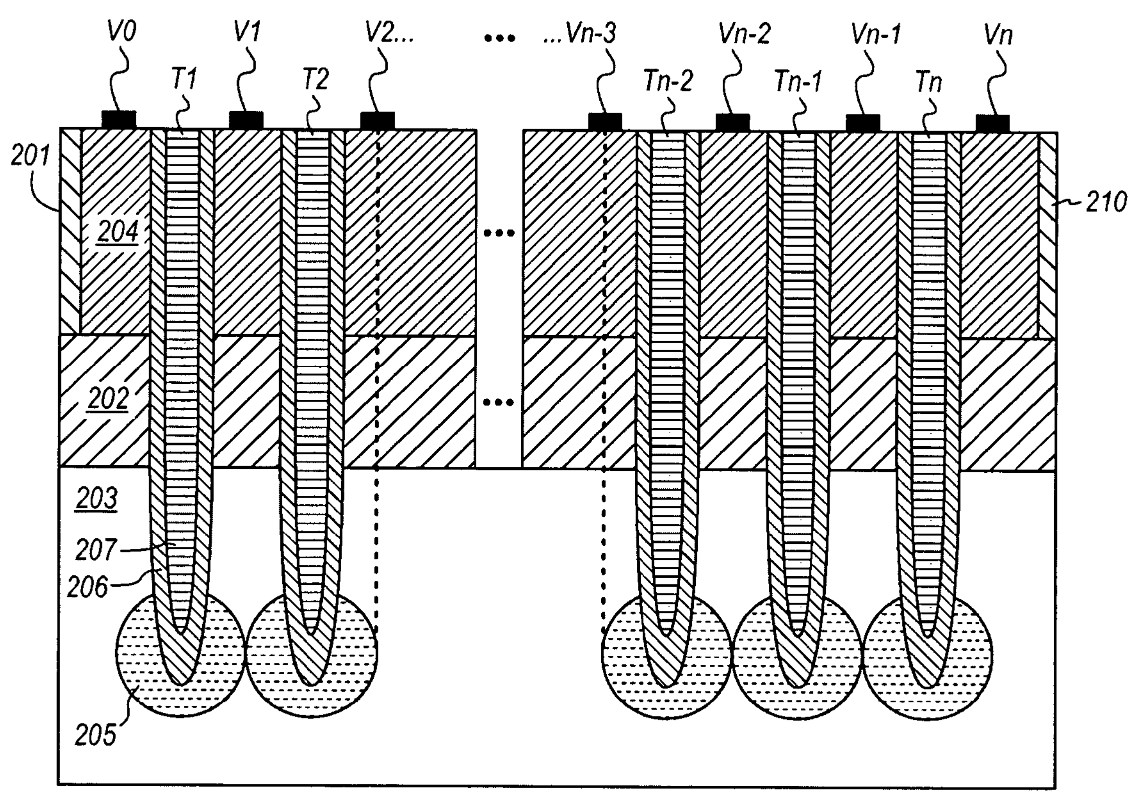
FIG. 2 shows a cross section view of an embodiment of the present invention.

FIG. 2 shows a cross section view of an embodiment of the present invention. It shows the voltage divider concept for a multi-trench structure as applied to a substrate (203). Multi-trench as used in the present invention means two or more trenches, three or more trenches, four or more trenches, etc, located between pockets. In embodiments of the present invention, the term “substrate” may also refer to a stack of materials, in particular a stack of a lowly doped p-layer on top of a highly doped p++ substrate. The term “substrate” may also include any underlying material or materials that may be used, or upon which a device, a circuit or an epitaxial layer may be formed. In other alternative embodiments, this “substrate” may include a semiconductor substrate such as e.g. doped silicon, a gallium arsenide (GaAs), a gallium arsenide phosphide (GaAsP), an indium phosphide (InP), a germanium (Ge), or a silicon germanium (SiGe) substrate. The “substrate” may include for example, an insulating layer such as a $SiO_2$ or a $Si_3N_4$ layer in addition to a semiconductor substrate portion. Thus, the term substrate also includes silicon-on-glass, silicon-on sapphire substrates. The term “substrate” is thus used to define generally the elements for layers that underlie a layer or portions of interest. Also, the “substrate” may be any other base on which a layer is formed, for example a glass or metal layer. In the following reference will mainly be made to a silicon substrate (203) for clarity purposes but the present invention is not limited thereto.

On top of a substrate of a first conductivity type, e.g. a p-substrate (203), a highly doped buried layer (202) of opposite doping, i.e. of a second conductivity type (e.g. n-type), is created by doping, e.g. by ion implantation and subsequent thermal annealing. By using a blanket i.e. non-masked approach, a sheet resistance of ~10-15Ω/square can be achieved. On top of the buried layer (202) a lowly doped epitaxial layer (201) of the same conductivity type as the buried layer (202) is grown. All active devices will be made in the lowly doped epitaxial layer (201) having a doping level typically between $10^{15}$-$10^{17}$ $cm^{-1}$. In order to connect the buried layer (202) at the top silicon, a self-aligned sinker (204) of the same conductivity type as the buried layer (202) is made. Two or more epitaxial pockets (201, . . . 210) are isolated from each other by a deep trench structure (Tn),—"deep" meaning that it extends at least several μm into the substrate (103), for example 1-3 μm or more. This indicates that the deep trench extends across the epitaxial layer (201), the buried layer (202) and ends in the substrate (103) below the buried layer. For example, the extension into the substrate (103) could be less than 3 μm, as long as it's long enough to pierce the buried layer (202) and to isolate the two or more epitaxial pockets. The trenches are formed by etching. Then a thick isolation layer (206) is grown or deposited on the trench sidewall. This can be oxide, nitride, or a combination of both, for example. The resulting trenches are filled with a filling material (207) like polysilicon, e.g. a conductive material. In order to kill any possible parasitic MOS transistor, an implant of the first conductivity type, e.g. a p-stop implant (205) is implanted at the trench bottom after the trench etching step. While not compulsory, the stopper implant (205) is useful in practice, to kill the parasitic MOS transistor discussed earlier. In particular, when a highly doped substrate (203) is used, the stopper implant (205) may be omitted. When a stack of p++/p-layers is used as a substrate (203), the stopper implant (205) may be omitted when the trenches extend into the p++ layer.

One semiconductor device (e.g. an active device such as a transistor) is located in the left-side epitaxial-pocket (201), and the adjacent semiconductor device (e.g. an active device such as a transistor) is located in the right-hand side epitaxial-pocket (210). In between them, a number (n) of trenches (Tn) are provided. Between each trench, a contacted semiconductor region, e.g. silicon region is present. The contact is biased to a given potential $V_i$ (i=1, . . . n−1). Each trench is similar to the structure shown in FIG. 1. In this first embodiment, the polysilicon layer (207) is left floating. In general, the upper layer between two successive trenches is a highly doped region (204) having a typical doping level between $10^{18}$ and $10^{20}$ $cm^{-3}$ and has the same conductivity type as that of a lower layer in the form of buried layer (202). While in this first preferred embodiment, the buried layer (202) is present and has a conductivity type opposite to the conductivity type of the substrate (203), the present invention may be extended to the case where either the buried layer (202) is absent or has the same conductivity type as that of the substrate (203). In these last two cases (i.e. buried layer absent or of the same conductivity as the substrate) the epitaxial layer (201) and the highly doped region (204) always have a conductivity type opposite to that of the substrate (203).

In a second embodiment, the polysilicon layer (207) can be contacted and biased to an optimum potential. As many trenches as required can be put next to each other. In practice, four trenches are typically sufficient for maximum gain in reverse blocking voltage.

A simple analytical model for the single and double trench isolation structures, using a capacitive network will now be explained. The model is based on a capacitor divider network, which in general for a single trench (referring to FIG. 1):

$$V_{poly} = \frac{C_{drain}}{C_{tot}} \cdot V_{drain} + \frac{C_{source}}{C_{tot}} \cdot V_{source} + \frac{C_{subs}}{C_{tot}} \cdot V_{subs} \quad (2)$$

in which:

$$C_{tot}=C_{subs}+C_{source}+C_{drain} \quad (3)$$

"Source" refers to contact (108), "drain" refers to contact (109), "gate" refers to region (110), "subs" refers to the substrate (103).

The capacitance of the source, drain and substrate regions depends on the depth of the trench, the thickness of the epitaxial layer of the second conductivity type, e.g. the n-type epitaxial layer, and the out-diffusion of the BLN, the dielectric thickness as well as on the width of the BLN-p-substrate depletion layer. The model assumes that the trench polysilicon is an equi-potential plane. The potential of the trench polysilicon is determined by the potential of source, drain and substrate and their respective capacitances according to eq. (2).

For a double isolation structure, each trench (inner and outer) have their own limiting voltage at which breakdown of the trench occurs. For the inner trench (the furthest left trench shown in FIG. 2), the limit is the same as for a single trench structure, as the source is assumed to be at ground ($V_0$=0V), though other levels are possible. Breakdown occurs when the trench polysilicon reaches a certain critical value, determined by the dielectric thickness and trench depth. This limit ($V_{poly1\_limit}$) can be determined from TCAD (Technology Computer Aided Design) simulations, and is independent of the $V_1$ voltage ($V_0$ is always at ground). TCAD (or Technology Computer Aided Design) allows to simulate the silicon processing (e.g. processes such as diffusion, oxidation, implants, etching, . . . ) as well as the electrical device characteristics. The single trench structure of FIG. 1 breaks down at a reverse blocking voltage $V_{bd}$ i.e. the voltage difference V(109)−V(108) at which current will flow between node 109 and node 108 or in other words the voltage difference V(109)-V(108) at which the isolation structure does not isolate the epi pockets on both sides of the trench isolation structure anymore At that moment $V_{poly1}=V_{poly1\_limit}$. In other words, the trench structure breaks down when a given voltage difference $V_{bd,\ t}=V_{bd}-V_{poly1\_limit}$ between the silicon and the trench poly is reached. Table 1 gives $V_{poly1\_limit}$ and $V_{bd,\ t}$.

In a multiple trench structure (see FIG. 2) $V_{bd}$ is the voltage difference Vn−V0 at which the isolation does not isolate the epitaxial pockets 201 and 210 anymore. In the case of a double trench structure, the outer trench (furthest right trench in FIG. 2) also has a limiting voltage $V_{poly2\_limit}$, which is dependent on the node $V_2$ and node $V_1$ voltage as the voltage of the node $V_1$ contact is coupled to the node $V_2$ voltage by a given ratio. The breakdown of the total structure ($V_{bd}$) will occur when $V_{bd,t}$ is reached, either at the inner or the outer trench.

$V_{poly1\_limit}$ is largely dependent on the dielectric thickness. A thicker dielectric will allow a larger potential drop across the dielectric, and hence a lower electric field in the silicon. Hence the voltage of poly1 will increase until breakdown is reached. Deeper trenches will have larger $C_{subs}$, and hence the potential in the poly will be pulled down, for the same given drain voltage, resulting in a lower $V_{poly1\_limit}$. Vbd seems to be independent of the trench depth.

TABLE 1

$V_{poly1\_limit}$ and $Vbd_t$, as determined from TCAD simulations. Csubs = 1e19 $cm^{-3}$, Tepi = 15 μm, Cpepi = 4e14 $cm^{-3}$, Tnepi = 3.5 μm, Cnepi = 8e15 $cm^{-3}$.

| Trench depth (μm) | Tox (nm) | $V_{poly1\_limit}$ (V) | $V_{bd,t}$ (V) |
|---|---|---|---|
| 20 | 500 | 18.7 | 70 |
| | 600 | 20.8 | 77 |
| | 800 | 24.4 | 88 |
| 25 | 500 | 14.0 | 71.5 |
| | 600 | 15.5 | 78 |
| | 800 | 18.2 | 88 |

Figure 3:
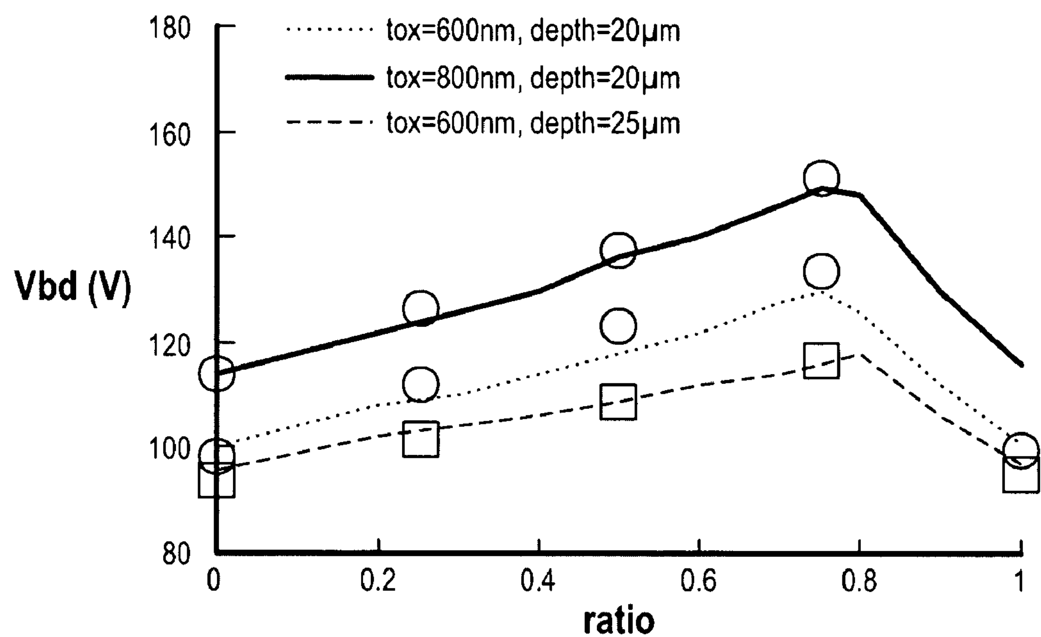
FIGS. 3 and 4 show graphs of breakdown voltages.

The overall results of the analytical model are shown in FIG. 3. This shows a graph of expected breakdown voltage for a double trench isolation structure (i=2): the points of the curve figured by circles and squares are obtained from TCAD simulations while the continuous lines represent the results of the capacitor model obtained for different thickness of the trench oxide and different trench depths. The x-axis shows the ratio $V_1/V_2$ of the outer trench voltage and the voltage applied to the inner silicon region (between trench 1 and 2). Referring to FIG. 2 (n=2): $V_0$=0V, $V_2$ is swept during the simulations between a minimum and a maximum, $V_1=V_2$*ratio. The Y-axis shows the reverse breakdown voltage of the full isolation structure i.e. the maximum voltage at node $V_2$ (at which breakdown occurs). The simulations and the modeling were done for different trench depths and dielectric thickness. A good agreement between analytical model and TCAD simulations is obtained. Trenches are left floating.

One clearly sees that the breakdown voltage $V_{bd}$ reaches a maximum for a given ratio value. Beyond that ratio value, the breakdown voltage decreases. It marks the start of avalanche at the inner trench (i.e. the most left trench shown in FIG. 2, with n=2) or the outer trench (i.e. the most right trench shown in FIG. 2, with n=2). By putting the ratio to a value between 0 and 1, the complete voltage is divided across two trenches instead of one single trench, allowing the structure to achieve a higher reverse breakdown voltage compared to a single trench structure.

The above described analytical model can be extended to multiple trenches. Calculations are done for a quadruple trench structure, $T_{pepi}$=15 μm, $T_{nepi}$=3.5 μm, $t_{ox}$=600 nm, trench depth=20 μm. The potential at the different contacts is defined according to a given ratio, according to (referring to FIG. 2 with n=4): $V_4$ is a variable parameter that is varied between a minimum and a maximum during the simulations, $V_3=V_4$*ratio, $V_2=V_3$*ratio, $V_1=V_2$*ratio, $V_1$=ground. The potential of the floating polysilicon filler material in the trenches (poly1, poly2, poly3 and poly4) is then calculated according to the capacitive network (see above). For each trench, a limiting poly potential above which avalanche occurs, is also calculated. Up to a ratio of 0.85, the potential of poly4 (outer trench) is the limiting factor determining the breakdown. For a ratio of 0.9, it is the potential at the inner trench (poly1) that determines the reverse blocking voltage of the total isolation structure.

Figure 4:
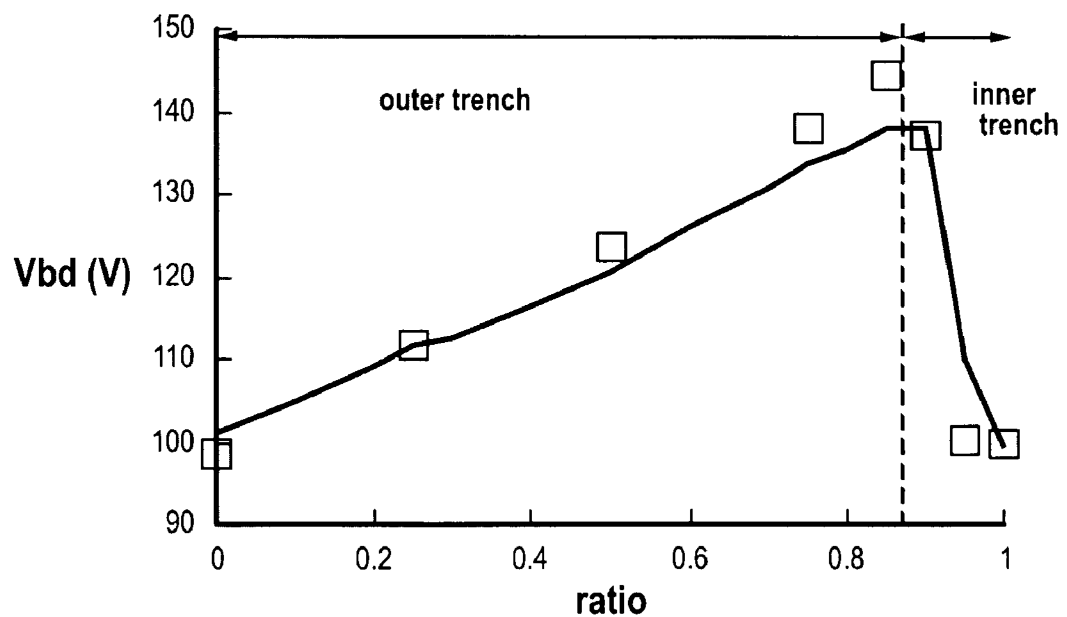

FIG. 4 shows the analytical model calculation for different ratios (biasing conditions of the different source contacts as described above), in addition to some TCAD simulated data, showing the expected gain for a quadruple trench isolation structure (n=4) as from TCAD simulations (symbols). The x-axis shows the ratio of the outer trench voltage being put at the inner silicon (between trench n-1 and n). Referring to FIG. 2 (with n=4): $V_0$=0V, $V_4$ is swept/varied between a minimum and a maximum, $V_3=V_4$*ratio, $V_2=V_3$*ratio, $V_1=V_2$*ratio. The Y-axis shows the reverse breakdown voltage of the full isolation structure i.e. the maximum voltage at node $V_4$. The full line represents the analytical capacitor model. A good agreement between the analytical model and the TCAD simulations is obtained. Trenches are left floating.

Figure 5:
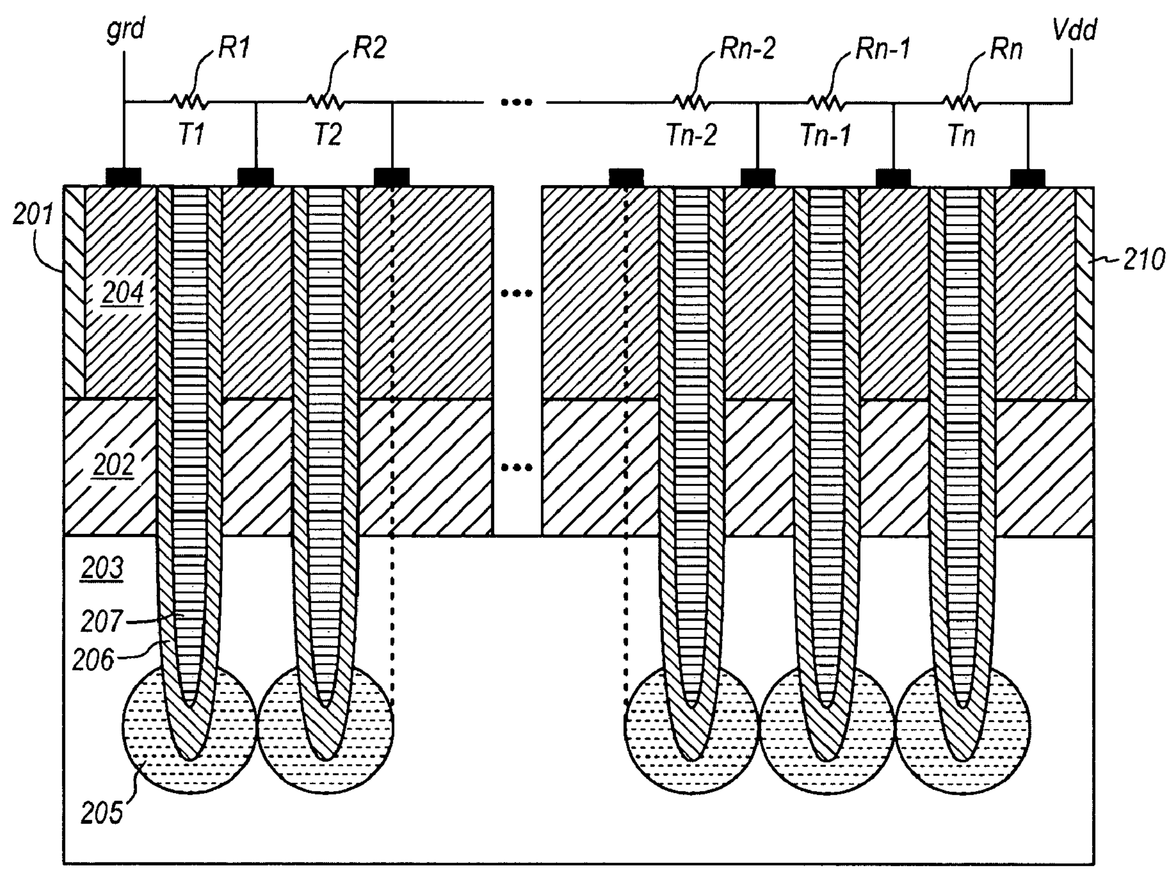
FIG. 5 shows a cross section view of another embodiment.

For voltage ratios between successive trench isolated islands up to and including 0.85, the outer trench will go into avalanche, while for ratios larger than 0.85, the inner trench goes in avalanche. This feature is predicted by the analytical model and is verified by TCAD simulations. Hence a ratio near 0.85 is a good value to use in practice. FIG. 5 shows another embodiment of the invention, similar to that of FIG. 2, but with a resistor network. Corresponding reference numerals are used as appropriate. The voltage divider concept can be implemented in several ways.

1. Each silicon island in between two trenches can be separately biased by an external supply. Appropriate supply voltages are provided for the different biases. External means external to the circuit to be isolated by the trenches, but can be internal to the chip e.g. by using level shifters.
2. A network of appropriate resistors can be built connecting the different islands, as shown in FIG. 5. Resistor R1 couples the silicon islands across the inner trench. Resistor R2 couples the islands either side of a next trench, and so on, until the islands around the outer trench are connected by resistor R(n). One end of this resistor network is connected to ground, and the other end to a voltage supply. In the example shown, the inner end is connected to ground and the outer end to Vdd. This is possibly an easier implementation than using multiple supply voltages, albeit somewhat area consuming (one needs large resistors in order to limit the current consumption).

Figure 6A:
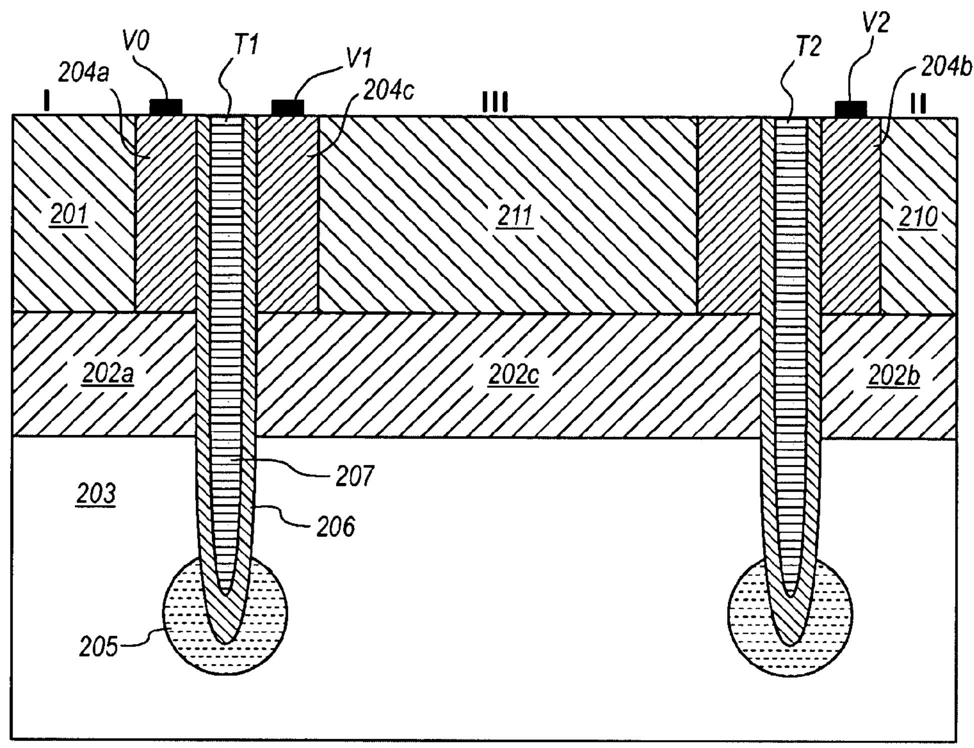
FIGS. 6*a* and 6*b* show further embodiments in accordance with the present invention.

FIG. 6*a* shows another embodiment having a similar structure to embodiments discussed above. The figure shows a semiconductor structure for isolating a first area I (comprising regions 201, 202*a*, 204*a*) of an integrated circuit from a second area II (comprising regions 210, 202*b*, 204*b*) of the integrated circuit, and having, for example:

A first trench ring (T1) adjacent to the first area of the integrated circuit;

A first conductive element (204*a* and the associated contact) to contact the first area of the integrated circuit;

A second trench ring (T2) adjacent to the second area of the integrated circuit; and surrounding the first trench A second conductive element (204*b* and the associated contact) to contact the second area of the integrated circuit;

A third area III (comprising in a first embodiment regions 211, 202*c*, 204*c*) of the integrated circuit delimited by the first and second trench rings;

A third conductive element (204*c* and the associated contact) to contact the third area of the integrated circuit, and means to maintain the third conductive element at an intermediate voltage (VI) between voltage levels (V0, V2) of the first and second conductive elements.

Figure 6B:
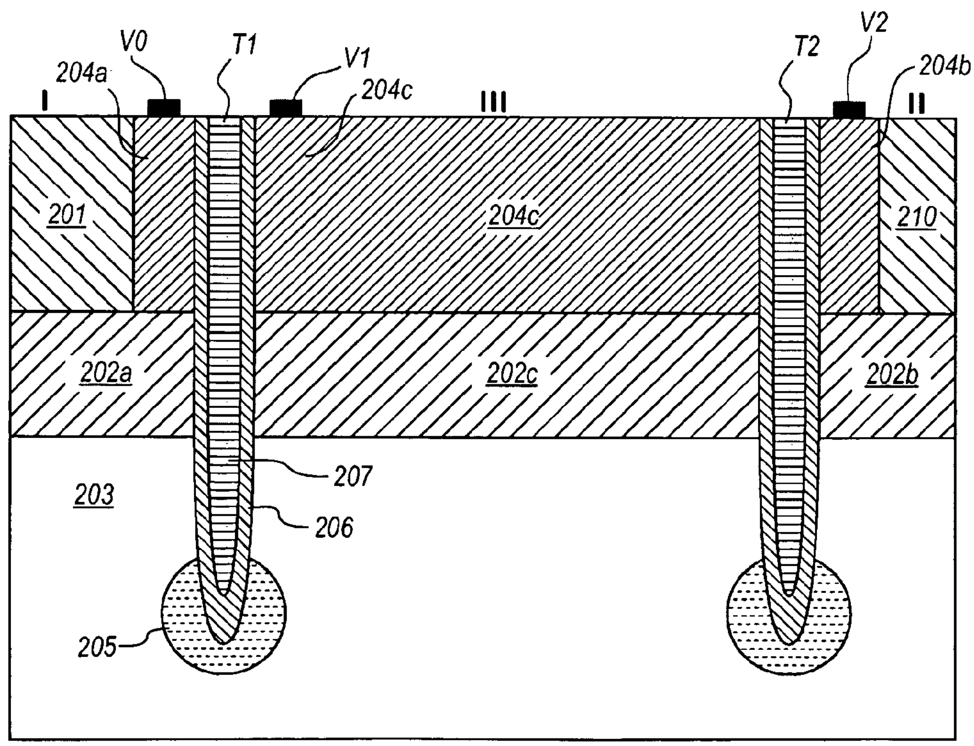

A further embodiment shown in FIG. 6*b*, is similar to that of FIG. 6*a*, but the third area may be limited to regions 202*c* and 204*c* as shown. The main difference is that there is no region 211 with a doping lower than the doping of region 204*c*.

An optional additional feature of the integrated semiconductor device is further regions on an inside and an outside of the isolation structure, and coupled to the bias arrangement. Another such feature is the regions comprising silicon islands. Another such feature is each region having an upper silicon layer such as 201, of either conductivity type, and lower silicon layers such as 202 and 203, layers 201 and 203 being of opposite conductivity types. Another such additional feature is the lower layer comprising a second silicon layer such as 202 of a second conductivity type, and another layer such as 203 of the first conductivity type. Another such feature is the trenches extending from a surface of the upper silicon layer 201 to the lower layer 203. Another such feature is a highly doped connection such as 204 made between the second layer and the silicon surface of the upper silicon layer 201, being of the same conductivity type as that of the second layer. Another such feature is the trenches being left floating. Optionally the poly trenches are separately contacted and biased. Optionally the bias arrangement is coupled to contacts on the upper silicon layer. Optionally the bias arrangement is arranged to provide a geometric progression of voltages across successive trenches. Optionally the bias arrangement comprises a resistor network for coupling to one or more supplies. Optionally the bias arrangement comprises a direct coupling from separate supplies for one or more of the regions.

In other words, at least some of the embodiments show a multi-trench isolation structure, of which each trench can have a silicon layer of the first conductivity type, a silicon layer of the second conductivity type, and a third layer of either conductivity type. The second layer has a high doping concentration. The first layer has preferably a high doping concentration, but this is not mandatory. The third layer has a lower doping concentration, but this is also not mandatory. A deep trench is present and extends from the silicon surface into the first silicon layer. A highly doped connection is made between the second layer and the silicon surface, being of the same conductivity type of the second layer, and made self-aligned to the trench. The number of trenches is not specified, but is larger than 1. The silicon islands in between two trenches are separately contacted. The trenches can be left floating.

Optionally the poly trenches are separately contacted and biased. Optionally the second layer (202) is absent. In this case, the third layer (201) must have the opposite conductivity type of the substrate material (203). Optionally the highly doped extension (204) is absent. Optionally the stopper implant (205) is absent. Optionally the substrate (203) is a stack of a highly doped layer and a lowly doped layer, the lowly doped layer being above the highly doped layer, and in contact with layer (202).

A way to bias the trench silicon pockets to a given ratio, given by the analytical model can improve the breakdown voltage by 50% for a quadruple trench structure. The silicon islands can e.g. be biased by separate supplies, or biased using a resistor network.

Applications include any smart power products, especially high temperature products. In principle any type of technology can be used for the integrated circuit, examples include CMOS, bipolar or BiCMOS semiconductor devices. They can be formed in the semiconductor substrate such that the devices are either circumscribed by the isolation trench or, when a buried horizontal insulator layer is present, completely surrounded by the isolation trench and the intersecting buried horizontal insulator layer.

What is claimed is:

1. An integrated semiconductor device having an isolation structure having two or more isolation trenches, and one or more regions in between the isolation trenches, and a bias arrangement coupled to the regions and arranged to divide a voltage across the isolation structure between the two or more isolation trenches.

2. The device of claim 1 having further regions on an inside and an outside of the isolation structure, and coupled to the bias arrangement.

3. The device of claim 2, the regions comprising islands of semiconductor material.

4. The device of claim 1, the regions comprising islands of semiconductor material.

5. The device of claim 1, the trenches each comprising a conductive region with a separate contact to the bias arrangement.

6. The device of claim 5, each region having a first upper semiconductor layer of a first conductivity type, and a lower semiconductor layer and the bias arrangement being coupled to contacts on the first upper semiconductor layer.

7. The device of claim 1, each region having a first upper semiconductor layer of a first conductivity type, and a lower semiconductor layer.

8. The device of claim 7, the lower semiconductor layer comprising a second semiconductor layer of either conductivity type, and a third layer of a second conductivity type.

9. The device of claim 8, the trenches extending from a surface of the first semiconductor layer to the third layer.

10. The device of claim 8, the third layer being a stack of a highly doped layer and a lowly doped layer, the lowly doped layer being above the highly doped layer, and in contact with the second semiconductor layer.

11. The device of claim 8, the conductive region comprising a highly doped connection extending from a depth of the third layer to the surface of the first semiconductor layer.

12. The device of claim 1, the trenches being left electrically floating.

13. The device of claim 1, the bias arrangement being arranged to provide a geometric progression of voltages across successive trenches.

14. The device of claim 1, the bias arrangement comprising a resistor network for coupling to one or more voltage supplies.

15. The device of claim 1, the bias arrangement comprising a coupling from separate voltage supplies for one or more of the regions.

16. A method of manufacturing the integrated semiconductor device of any preceding claim, having the steps of forming two or more isolation trenches of an isolation structure, and forming one or more regions in between the isolation trenches, and forming a bias arrangement coupled to the regions so as to divide a voltage across the isolation structure between the two or more isolation trenches.

* * * * *